(12) United States Patent
Tan et al.

(10) Patent No.: US 8,927,332 B2
(45) Date of Patent: Jan. 6, 2015

(54) METHODS OF MANUFACTURING SEMICONDUCTOR DEVICE ASSEMBLIES INCLUDING FACE-TO-FACE SEMICONDUCTOR DICE

(71) Applicants: Swee Seng Eric Tan, Singapore (SG); Choon Kuan Lee, Singapore (SG)

(72) Inventors: Swee Seng Eric Tan, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/728,456

(22) Filed: Dec. 27, 2012

(65) Prior Publication Data

US 2013/0115734 A1 May 9, 2013

Related U.S. Application Data

(62) Division of application No. 11/359,985, filed on Feb. 22, 2006, now Pat. No. 8,384,200.

(30) Foreign Application Priority Data

Feb. 20, 2006 (SG) .............................. 200601117-5

(51) Int. Cl.
*H01L 21/00* (2006.01)
*H01L 23/02* (2006.01)
*H01L 29/40* (2006.01)
*H01L 25/065* (2006.01)
*H01L 21/44* (2006.01)
*H01L 25/18* (2006.01)

(52) U.S. Cl.
CPC ....... *H01L 21/44* (2013.01); *H01L 2924/15311* (2013.01); *H01L 2924/01087* (2013.01);

(Continued)

(58) Field of Classification Search
USPC .................................. 438/109; 257/686, 777
See application file for complete search history.

(56) References Cited

U.S. PATENT DOCUMENTS 4,748,495 A 5/1988 Kucharek
4,991,000 A 2/1991 Bone et al.

(Continued)

FOREIGN PATENT DOCUMENTS

DE 102004018434 A1 12/2004
JP 3-286553 * 12/1991

(Continued)

OTHER PUBLICATIONS

Singapore Search Report, Singapore Application No. 201101031-1, mailed Sep. 9, 2011, eight (8) pages.

(Continued)

*Primary Examiner* — James Mitchell
(74) *Attorney, Agent, or Firm* — TraskBritt

(57) ABSTRACT

Methods of manufacturing semiconductor device assemblies include attaching a back side of a first semiconductor die to a substrate and structurally and electrically coupling a first end of laterally extending conductive elements to conductive terminals on or in a surface of the substrate. Second ends of the laterally extending conductive elements are structurally and electrically coupled to bond pads on or in an active surface of the first semiconductor die. Conductive structures are structurally and electrically coupled to bond pads of a second semiconductor die. At least some of the conductive structures are aligned with at least some of the bond pads of the first semiconductor die. An active surface of the second semiconductor die faces an active surface of the first semiconductor die. At least some of the conductive structures are structurally and electrically coupled to at least some of the bond pads of the first semiconductor die.

20 Claims, 6 Drawing Sheets

(52) U.S. Cl.
CPC ......... *H01L 2924/14* (2013.01); *H01L 25/0657*
(2013.01); *H01L 2224/32145* (2013.01); *H01L*
*2224/4943* (2013.01); *H01L 2924/01079*
(2013.01); *H01L 2225/06513* (2013.01); *H01L*
*2225/06575* (2013.01); *H01L 2224/32225*
(2013.01); *H01L 2924/01078* (2013.01); *H01L*
*2224/73265* (2013.01); *H01L 2225/06579*
(2013.01); *H01L 2225/0651* (2013.01); *H01L*
*2224/73215* (2013.01); *H01L 2224/4824*
(2013.01); *H01L 25/18* (2013.01); *H01L*
*2224/16145* (2013.01)
USPC ........................... 438/106; 257/686; 257/777

(56) References Cited

U.S. PATENT DOCUMENTS

| | | | |
|---|---|---|---|
| 4,996,587 A | 2/1991 | Hinrichsmeyer et al. | |
| 5,012,323 A | 4/1991 | Farnworth | |
| 5,016,138 A | 5/1991 | Woodman | |
| 5,045,921 A | 9/1991 | Lin et al. | |
| 5,107,328 A | 4/1992 | Kinsman | |
| 5,128,831 A | 7/1992 | Fox, III et al. | |
| 5,137,836 A | 8/1992 | Lam | |
| 5,155,067 A | 10/1992 | Wood et al. | |
| 5,239,198 A | 8/1993 | Lin et al. | |
| 5,255,156 A | 10/1993 | Chang | |
| 5,280,192 A | 1/1994 | Kryzaniwsky | |
| 5,291,061 A | 3/1994 | Ball | |
| 5,323,060 A | 6/1994 | Fogal et al. | |
| 5,422,435 A | 6/1995 | Takiar et al. | |
| 5,424,652 A | 6/1995 | Hembree et al. | |
| 5,438,224 A | 8/1995 | Papageorge et al. | |
| 5,477,067 A | 12/1995 | Isomura et al. | |
| 5,477,082 A | 12/1995 | Buckley, III et al. | |
| 5,484,959 A | 1/1996 | Burns | |
| 5,495,398 A | 2/1996 | Takiar et al. | |
| 5,502,289 A | 3/1996 | Takiar et al. | |
| 5,508,565 A | 4/1996 | Hatakeyama et al. | |
| 5,602,420 A | 2/1997 | Ogata et al. | |
| 5,677,567 A | 10/1997 | Ma et al. | |
| 5,677,569 A | 10/1997 | Choi et al. | |
| 5,689,135 A | 11/1997 | Ball | |
| 5,770,480 A | 6/1998 | Ma et al. | |
| 5,784,264 A | 7/1998 | Tanioka | |
| 5,834,836 A | 11/1998 | Park et al. | |
| 5,894,165 A | 4/1999 | Ma et al. | |
| 5,898,220 A | 4/1999 | Ball | |
| 5,917,242 A | 6/1999 | Ball | |
| 5,952,725 A | 9/1999 | Ball | |
| 6,016,256 A | 1/2000 | Crane, Jr. et al. | |
| 6,048,753 A | 4/2000 | Farnworth et al. | |
| 6,069,025 A | 5/2000 | Kim | |
| 6,080,264 A | 6/2000 | Ball | |
| 6,080,931 A | 6/2000 | Park et al. | |
| 6,087,718 A | 7/2000 | Cho | |
| 6,137,164 A | 10/2000 | Yew et al. | |
| 6,184,463 B1 | 2/2001 | Panchou et al. | |
| 6,208,018 B1 | 3/2001 | Ma et al. | |
| 6,218,214 B1 | 4/2001 | Panchou et al. | |
| 6,232,148 B1 | 5/2001 | Ma et al. | |
| 6,261,865 B1 | 7/2001 | Akram | |
| 6,266,246 B1 | 7/2001 | Crane, Jr. et al. | |
| 6,313,527 B1 | 11/2001 | Han et al. | |
| 6,324,072 B1 | 11/2001 | Lorenz et al. | |
| 6,337,227 B1 | 1/2002 | Ball | |
| 6,353,263 B1 * | 3/2002 | Dotta et al. | 257/777 |
| 6,458,625 B2 | 10/2002 | Akram | |
| 6,472,758 B1 | 10/2002 | Glenn et al. | |
| 6,500,696 B2 | 12/2002 | Sutherland | |
| 6,507,098 B1 * | 1/2003 | Lo et al. | 257/686 |
| 6,531,782 B1 | 3/2003 | Jones et al. | |
| 6,531,784 B1 | 3/2003 | Shim et al. | |
| 6,555,917 B1 * | 4/2003 | Heo | 257/777 |
| 6,559,531 B1 | 5/2003 | Sutherland | |
| 6,576,992 B1 | 6/2003 | Cady et al. | |
| 6,584,681 B2 | 7/2003 | Lorenz et al. | |
| 6,621,156 B2 | 9/2003 | Kimura | |
| 6,642,613 B1 * | 11/2003 | Nguyen et al. | 257/686 |
| 6,650,019 B2 | 11/2003 | Glenn et al. | |
| 6,673,650 B2 | 1/2004 | Akram | |
| 6,682,954 B1 | 1/2004 | Ma et al. | |
| 6,753,613 B2 | 6/2004 | Levardo et al. | |
| 6,762,488 B2 * | 7/2004 | Maeda et al. | 257/686 |
| 6,781,225 B2 | 8/2004 | Chiang et al. | |
| 6,784,023 B2 | 8/2004 | Ball | |
| 6,815,251 B1 | 11/2004 | Akram et al. | |
| 6,828,686 B2 | 12/2004 | Park | |
| 6,857,470 B2 | 2/2005 | Park et al. | |
| 6,861,761 B2 * | 3/2005 | Yang et al. | 257/777 |
| 6,897,096 B2 | 5/2005 | Cobbley et al. | |
| 6,955,941 B2 | 10/2005 | Bolken | |
| 6,965,160 B2 | 11/2005 | Cobbley et al. | |
| 7,071,421 B2 * | 7/2006 | Heng et al. | 174/260 |
| 7,105,930 B2 | 9/2006 | Lua et al. | |
| 7,166,924 B2 | 1/2007 | Lu et al. | |
| 7,189,593 B2 * | 3/2007 | Lee | 438/107 |
| 7,298,032 B2 | 11/2007 | Kim et al. | |
| 7,501,707 B2 * | 3/2009 | Morishita et al. | 257/777 |
| 7,518,223 B2 | 4/2009 | Derderian | |
| 8,143,716 B2 * | 3/2012 | Kawano et al. | 257/686 |
| 2001/0014488 A1 | 8/2001 | Akram | |
| 2001/0020739 A1 | 9/2001 | Honda | |
| 2002/0017722 A1 | 2/2002 | Masuda | |
| 2002/0096755 A1 | 7/2002 | Fukui et al. | |
| 2003/0038353 A1 | 2/2003 | Derderian | |
| 2003/0038355 A1 | 2/2003 | Derderian | |
| 2003/0038356 A1 | 2/2003 | Derderian | |
| 2003/0042615 A1 | 3/2003 | Jiang et al. | |
| 2003/0064547 A1 | 4/2003 | Akram et al. | |
| 2003/0127423 A1 | 7/2003 | Dlugokecki et al. | |
| 2003/0189259 A1 | 10/2003 | Kurita et al. | |
| 2003/0197281 A1 | 10/2003 | Farnworth et al. | |
| 2004/0036171 A1 | 2/2004 | Farnworth et al. | |
| 2004/0159954 A1 | 8/2004 | Hetzel et al. | |
| 2004/0201088 A1 | 10/2004 | Kim et al. | |
| 2004/0241908 A1 | 12/2004 | Choi | |
| 2005/0045378 A1 | 3/2005 | Heng et al. | |
| 2005/0258529 A1 * | 11/2005 | Green et al. | 257/686 |
| 2006/0022323 A1 * | 2/2006 | Swee Seng | 257/686 |
| 2006/0049528 A1 * | 3/2006 | Kang et al. | 257/777 |
| 2006/0071305 A1 | 4/2006 | Ho et al. | |
| 2006/0094160 A1 * | 5/2006 | Akram | 438/109 |
| 2006/0097402 A1 * | 5/2006 | Pu et al. | 257/777 |
| 2006/0108697 A1 | 5/2006 | Wang et al. | |
| 2006/0125110 A1 | 6/2006 | Do et al. | |
| 2007/0194415 A1 | 8/2007 | Seng et al. | |

FOREIGN PATENT DOCUMENTS

| | | |
|---|---|---|
| JP | 06188362 A | 7/1994 |
| JP | 09330952 A | 12/1997 |
| JP | 2005175260 A | 6/2005 |
| JP | 2005223162 A | 8/2005 |
| KR | 2003095036 | 12/2003 |

OTHER PUBLICATIONS

Singapore Written Opinion, Singapore Application No. 201101031-1, mailed Sep. 9, 2011, ten (10) pages.
Singapore Written Opinion, Singapore Application No. 201101031-1, mailed Mar. 15, 2012, 10 pages.

* cited by examiner

METHODS OF MANUFACTURING SEMICONDUCTOR DEVICE ASSEMBLIES INCLUDING FACE-TO-FACE SEMICONDUCTOR DICE

CROSS-REFERENCE TO RELATED APPLICATION

This application is a divisional of U.S. patent application Ser. No. 11/359,985, filed Feb. 22, 2006, and entitled "Semiconductor Device Assemblies Including Face-To-Face Semiconductor Dice, Systems Including Such Assemblies, and Methods for Fabricating Such Assemblies," now U.S. Pat. No. 8,384,200, issued Feb. 26, 2013, which claims foreign priority benefits of Singapore Application No 200601117-5, filed Feb. 20, 2006, all of which are incorporated herein by reference in their entirety.

BACKGROUND

The present invention relates generally to semiconductor device assemblies that include what are commonly referred to as "multi-chip modules," in which two or more semiconductor dice are stacked relative to one another. More particularly, the present invention relates to semiconductor device assemblies that include two semiconductor dice stacked together in a face-to-face configuration, laterally extending conductive members providing electrical communication between bond pads on active surfaces of the semiconductor dice and a substrate. The present invention also relates to methods of manufacturing such semiconductor device assemblies.

Integrated circuit semiconductor devices are small electronic circuits formed on or in a surface of a wafer of semiconductor material such as, for example, silicon, gallium arsenide, or other III-V type semiconductor materials. Generally, a plurality of integrated circuit devices is fabricated simultaneously on a single wafer. The wafer is then subdivided into discrete devices (each of which is often referred to as a semiconductor "chip" or "die"), which then may be further processed and "packaged" to provide an end product. Packaging of a semiconductor device typically includes, among other processes, encapsulating at least a portion of the semiconductor die in a dielectric material to electrically insulate and physically protect the relatively fragile semiconductor die. Such semiconductor devices are produced and sold in various package configurations including, for example, lead frame configurations, chip-on-board (COB) configurations, board-on-chip (BOC) configurations, and flip-chip configurations.

The continuing demand for miniaturization of high performance electronic devices (such as cell phones, portable computers, and other hand-held devices) has required that integrated circuit semiconductor devices be as small as possible and consume as little surface area as possible on the circuit boards or other substrates on which they are mounted.

In an effort to conserve the amount of surface area occupied by integrated circuit devices on a substrate, various types of increased density packages have been developed. Among these semiconductor device packages are the so-called multi-chip modules (MCM), which may include assemblies of semiconductor devices that are stacked one on top of another. The amount of surface area on a carrier substrate that may be saved by stacking semiconductor devices is readily apparent—a stack of semiconductor devices consumes roughly the same surface area on a carrier substrate as a single, horizontally oriented semiconductor device or semiconductor device package.

Multi-chip modules may contain a number of semiconductor devices that perform the same or different functions, effectively combining the functionality of all of the semiconductor devices thereof into a single package.

A multi-chip module 10 is shown in FIG. 1A. The multi-chip module 10 is configured as a chip-on-board (COB) type semiconductor package, in which a first semiconductor die 12 having an active surface 14 and a back side 15 is mounted on a substrate 22 such that the active surface 14 faces upward and the back side 15 is disposed adjacent and attached to the substrate 22 by way of an adhesive material 24.

The multi-chip module 10 also includes a second semiconductor die 16 having an active surface 18 and a back side 19. The second semiconductor die 16 is mounted to and positioned vertically above the first semiconductor die 12 such that the active surface 18 faces upward and the back side 19 is disposed adjacent and attached to the first semiconductor die 12 by way of an adhesive material 24.

The first semiconductor die 12 may include a plurality of electrically conductive bond pads 28 disposed on the active surface 14 thereof, and the second semiconductor die 16 may include a plurality of electrically conductive bond pads 28' disposed on the active surface 18 thereof. The conductive bond pads 28, 28' may electrically communicate with the integrated circuits contained within each of the respective semiconductor dice 12, 16. As shown in FIG. 1B, the bond pads 28, 28' may be disposed in one or more rows extending substantially along or proximate to a centerline 21 of each of the first semiconductor die 12 and the second semiconductor die 16.

Laterally extending conductive elements 26 such as bond wires are used to provide electrical communication between conductive bond pads 28 on the active surface 14 of the first semiconductor die 12 and conductive terminals 30 on a first surface of the substrate 22, and between conductive bond pads 28' on the active surface 18 of the second semiconductor die 16 and the conductive terminals 30 on the first surface of the substrate 22. The multi-chip module 10 may also include an encapsulating material 36 that is used to protect and insulate the first semiconductor die 12, the second semiconductor die 16, and the laterally extending conductive elements 26.

Horizontally extending conductive traces and vertically extending conductive vias may be used to provide electrical communication between the conductive terminals 30 and conductive terminals 32 provided on a second, opposite surface of the substrate 22. Conductive solder bumps 34 may be provided on the conductive terminals 32 and used to structurally and electrically couple the multi-chip module 10 to a higher-level substrate such as a circuit board.

Another multi-chip module 38 is shown in FIG. 2. The multi-chip module 38 is configured as a board-on-chip (BOC) type semiconductor package, in which a first semiconductor die 12 having an active surface 14 and a back side 15 is mounted on a substrate 40 such that the active surface 14 faces downward and is disposed adjacent and attached to the substrate 40 by way of an adhesive material 24.

The substrate 40 shown in FIG. 2 is substantially similar to the substrate 22 shown in FIG. 1A. The substrate 40, however, also includes an aperture 42 through which the plurality of bond pads 28 disposed on the active surface 14 of the first semiconductor die 12 are exposed. Laterally extending conductive elements 26 such as bond wires that extend through the aperture 42 are used to provide electrical communication between the bond pads 28 disposed on the active surface 14 of the first semiconductor die 12 and conductive terminals or traces on the second side of the substrate 40 opposite the semiconductor die 12.

The multi-chip module 38 also includes a second semiconductor die 16 having an active surface 18 and a back side 19. The second semiconductor die 16 is mounted to and positioned vertically above the first semiconductor die 12 such that the active surface 18 faces upward and the back side 19 is disposed adjacent and attached to the back side 15 of the first semiconductor die 12 by way of an adhesive material 24. Laterally extending conductive elements 26 such as bond wires are used to provide electrical communication between the bond pads 28' disposed on the active surface 18 of the second semiconductor die 16 and conductive terminals 30 on the substrate 40. As previously discussed in relation to FIG. 1B, the bond pads 28 of the first semiconductor die 12 and the bond pads 28' of the second semiconductor die 16 may be disposed in one or more rows extending substantially along or proximate to a centerline 21 of each of the first semiconductor die 12 and the second semiconductor die 16.

The multi-chip module 38 may also include an encapsulating material 36 that is used to protect and insulate the first semiconductor die 12, the second semiconductor die 16, and the laterally extending conductive elements 26.

Horizontally extending conductive traces and vertically extending conductive vias may be used to provide electrical communication between the conductive terminals 30 and conductive terminals 32 provided on a second, opposite surface of the substrate 22. Conductive solder bumps 34 may be provided on the conductive terminals 32 and used to structurally and electrically couple the multi-chip module 38 to a higher-level substrate such as a circuit board.

A large number of manufacturing processes or steps are required to fabricate the devices shown in FIGS. 1A and 1B and FIG. 2, each of which contributes to the cost of the device.

There is a need for multi-chip modules that require fewer manufacturing processes for fabrication thereof, include fewer components, exhibit improved electrical performance, and that are smaller than multi-chip modules presently known in the art.

BRIEF SUMMARY

The features, advantages, and alternative aspects of the present invention will be apparent to those skilled in the art from a consideration of the following detailed description taken in combination with the accompanying drawings.

In one aspect, the present invention includes a semiconductor device assembly. The semiconductor device assembly includes a first semiconductor die and at least a second semiconductor die. The semiconductor device assembly may include a substrate with a plurality of conductive terminals disposed on or in a surface thereof. The first semiconductor die has an active surface with a plurality of bond pads disposed in a first selected connection pattern on or in the active surface. The second semiconductor die also includes an active surface with a plurality of bond pads disposed in a second selected connection pattern on or in the active surface. The active surface of the first semiconductor die faces the active surface of the second semiconductor die. Each of a plurality of conductive structures may be electrically and structurally coupled to a bond pad of the first semiconductor die and a bond pad of the second semiconductor die. A first end of each of a plurality of laterally extending conductive elements may be structurally and electrically coupled to a conductive terminal of the substrate, and a second end of each laterally extending conductive element is structurally and electrically coupled to at least one of a bond pad of the first semiconductor die, a bond pad of the second semiconductor die, and a conductive structure.

In another aspect, the present invention includes an electronic system that includes at least one memory device, at least one electronic signal processing device, and at least one input or output device. The at least one memory device includes a semiconductor device assembly that has a substrate, a first semiconductor die, and at least a second semiconductor die. The substrate may have a plurality of conductive terminals disposed on or in a surface thereof. The first semiconductor die includes an active surface with a plurality of bond pads disposed in a first selected connection pattern on or in the active surface. The second semiconductor die also includes an active surface with a plurality of bond pads disposed in a second selected connection pattern on or in the active surface. The active surface of the first semiconductor die faces the active surface of the second semiconductor die. Each of a plurality of conductive structures is electrically and structurally coupled to a bond pad of the first semiconductor die and a bond pad of the second semiconductor die. A first end of each of a plurality of laterally extending conductive elements may be structurally and electrically coupled to a conductive terminal of the substrate, and a second end of each bond wire is structurally and electrically coupled to at least one of a bond pad of the first semiconductor die, a bond pad of the second semiconductor die, and a conductive structure.

In yet another aspect, the present invention includes a method of assembling semiconductor device components. A back side of a first semiconductor die may be attached to a substrate. A first end of each of a plurality of laterally extending conductive elements may be structurally and electrically coupled to one of a plurality of conductive terminals on or in a surface of the substrate, and a second end of each of the laterally extending conductive elements may be structurally and electrically coupled to one of a plurality of bond pads on or in an active surface of the first semiconductor die. At least some of a plurality of conductive structures may be structurally and electrically coupled to one of a plurality of bonds pads of a second semiconductor die. At least some of the conductive structures are aligned with at least some bond pads of the first semiconductor die, the active surface of the second semiconductor die facing an active surface of the first semiconductor die. At least some of the conductive structures are structurally and electrically coupled to at least some of the bond pads of the first semiconductor die.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION

Figure 1A:
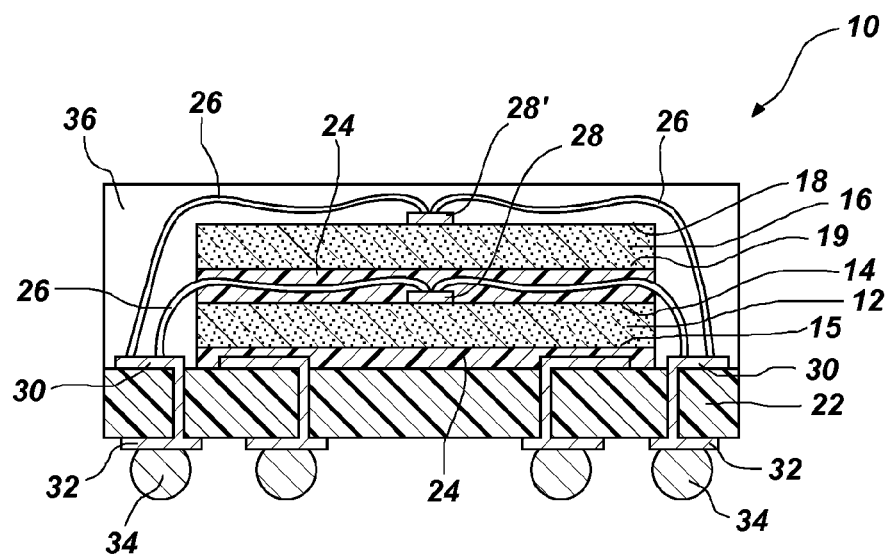
FIG. 1A is a cross-sectional side view of a known multi-chip module.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Figure 3:
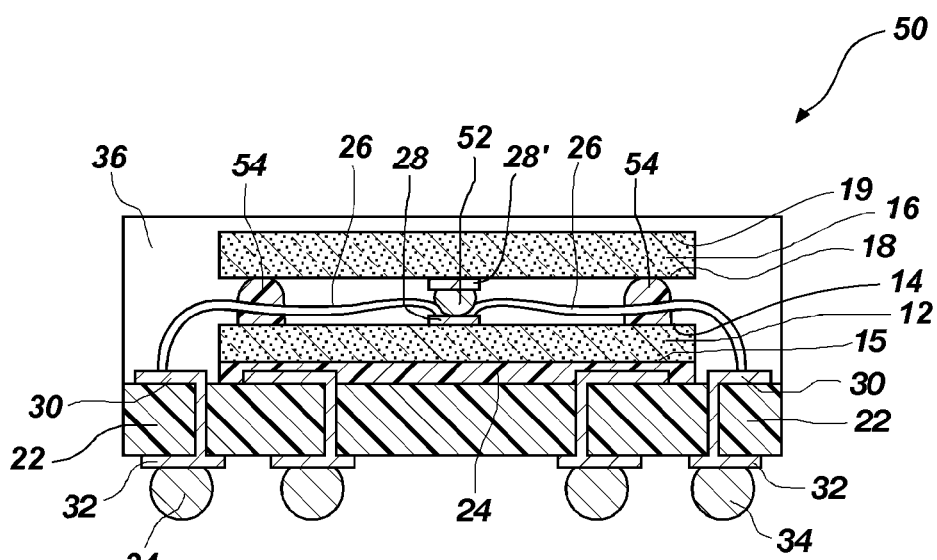
FIG. 3 is a cross-sectional side view of an illustrative semiconductor device assembly that embodies teachings of the present invention.

An illustrative semiconductor device assembly 50 that embodies teachings of the present invention is shown in FIG. 3. The semiconductor device assembly 50 includes a multi-chip module, which may include a first semiconductor die 12, a second semiconductor die 16, and a substrate 22. The first semiconductor die 12 may include an active surface 14, a back side 15, and a plurality of bond pads 28 disposed on or in the active surface 14. Similarly, the second semiconductor die 16 may include an active surface 18, a back side 19, and a plurality of bond pads 28' disposed on or in the active surface 18. Each of the bond pads 28, 28' may electrically communicate with integrated circuitry (not shown) contained within the semiconductor die on or in which the respective bond pad 28, 28' is disposed, and each bond pad 28, 28' may be configured to carry input/output signals, power voltages, or ground voltages to the integrated circuits contained within the semiconductor dice 12, 16.

The integrated circuit contained within the second semiconductor die 16 may be substantially identical to the integrated circuit contained within the first semiconductor die 12. Alternatively, the integrated circuit contained within the second semiconductor die 16 may differ from the integrated circuit contained within the first semiconductor die 12. Moreover, the semiconductor device assembly 50 may include one or more additional semiconductor dice stacked above the second semiconductor die 16.

Figure 1B:
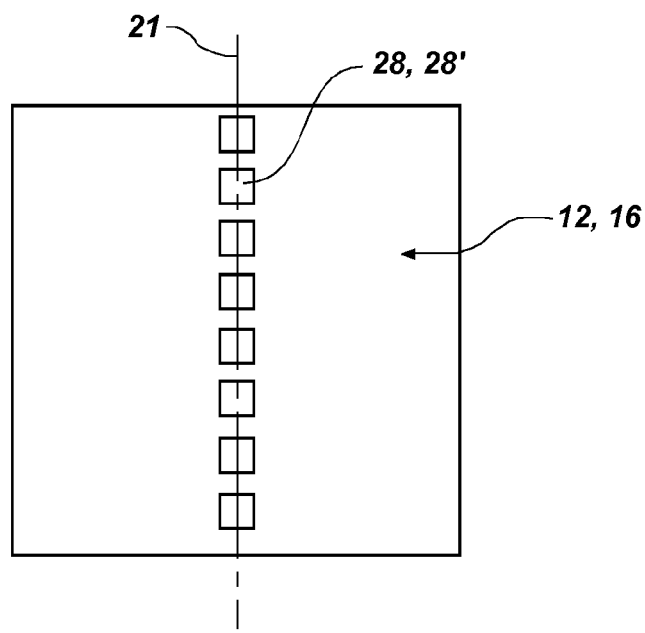
FIG. 1B is a top plan view of a semiconductor die of the multi-chip module shown in FIG. 1A.
Figure 2:
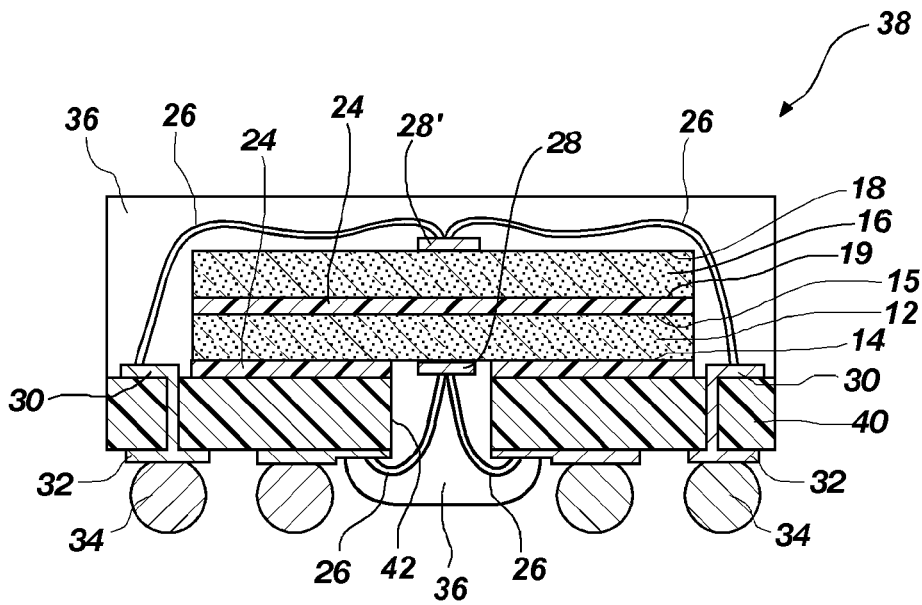
FIG. 2 is a cross-sectional side view of another known multi-chip module.

The bond pads 28 of the first semiconductor die 12 and the bond pads 28' of the second semiconductor die 16 may be disposed in one or more rows extending substantially along or proximate to a centerline 21 of each of the respective dice in a manner similar to that illustrated in FIG. 1B. In this particular configuration, the bond pads 28' on or in the active surface 18 of the second semiconductor die 16 may be disposed in a connection pattern that is substantially identical to a connection pattern in which the bond pads 28 on or in the active surface 14 of the first semiconductor die 12 are disposed. In other embodiments, the bond pads 28 of the first semiconductor die 12 and the bond pads 28' of the second semiconductor die 16 may be disposed in other connection patterns.

The active surface 14 of the first semiconductor die 12 may face the active surface 18 of the second semiconductor die 16. At least some of the bond pads 28 of the first semiconductor die 12 may be disposed in a first selected connection pattern, and at least some of the bond pads 28' of the second semiconductor die 16 may be disposed in a second selected connection pattern that is a mirror image of the first selected connection pattern. In this configuration, at least some of the bond pads 28 of the first semiconductor die 12 may be aligned with at least some of the bond pads 28' of the second semiconductor die 16 when the first semiconductor die 12 and the second semiconductor die 16 are oriented and aligned in a face-to-face (or active surface-to-active surface) configuration.

Laterally extending conductive elements 26 may be used to provide electrical communication between conductive bond pads 28 on the active surface 14 of the first semiconductor die 12 and conductive terminals 30 on a first surface of the substrate 22, and between conductive bond pads 28' on the active surface 18 of the second semiconductor die 16 and the conductive terminals 30 on the first surface of the substrate 22. By way of example and not limitation, the laterally extending conductive elements 26 may include bond wires. Alternatively, the laterally extending conductive elements 26 may include conductive leads of a lead frame or conductive traces carried by a flexible dielectric substrate such as tape or film, such as those used in conventional tape automated bonding (TAB) processes. A first end of each laterally extending conductive element 26 may be electrically and structurally coupled to a conductive terminal 30 on a surface of the substrate 22, and a second, opposite end of each laterally extending conductive element 26 may be electrically and structurally coupled to at least one of a bond pad 28 on the active surface 14 of the first semiconductor die 12, a bond pad 28' on the active surface 18 of the second semiconductor die 16, and a conductive structure 52. By way of example and not limitation, the second end of each laterally extending conductive element 26 may be electrically and structurally coupled to both a bond pad 28 on the active surface 14 of the first semiconductor die 12 and a conductive structure 52.

Each bond pad 28' disposed on the active surface 18 of the second semiconductor die 16 may be electrically and structurally coupled to a bond pad 28 disposed on the active surface 14 of the first semiconductor die 12 by way of a conductive structure 52. Each conductive structure 52 may be electrically and structurally coupled directly to a bond pad 28 of the first semiconductor die 12 and directly to a bond pad 28' of the second semiconductor die 16. By way of example and not limitation, the electrically conductive structures 52 may include electrically conductive metal balls or bumps. Such electrically conductive metal balls or bumps may include, for example, gold, silver, platinum, copper, alloys of such metals, or a solder alloy. Alternatively, the electrically conductive structures 52 may include conductor-filled epoxy material or anisotropically conductive tape or film. The electrically conductive structures 52 may be used to at least partially secure the second semiconductor die 16 to the first semiconductor die 12, in addition to providing electrical communication between the bond pads 28' disposed on the active surface 18 of the second semiconductor die 16 and the bond pads 28 disposed on the active surface 14 of the first semiconductor die 12 and the laterally extending conductive elements 26.

Alternatively, only some of the bond pads 28' disposed on the active surface 18 of the second semiconductor die 16 may be electrically and structurally coupled to a bond pad 28 disposed on the active surface 14 of the first semiconductor die 12. For example, at least one of the bond pads 28 disposed on the active surface 14 of the first semiconductor die 12 may be electrically isolated from all of the bond pads 28' disposed on the active surface 18 of the second semiconductor die 16. Similarly, at least one of the bond pads 28' disposed on the active surface 18 of the second semiconductor die may be electrically isolated from all of the bond pads 28 disposed on the active surface 14 of the first semiconductor die 12.

The semiconductor device assembly 50 may also include a plurality of dielectric structures 54 disposed between the active surface 14 of the first semiconductor die 12 and the active surface 18 of the second semiconductor die 16. The dielectric structures 54 may be configured to at least partially secure the second semiconductor die 16 to the first semiconductor die 12. Moreover, the dielectric structures 54 may be configured to separate the second semiconductor die 16 from the first semiconductor die 12 by a selected, fixed distance. The dielectric structures 54 may additionally or alternatively be configured to support the laterally extending conductive elements 26 between the first semiconductor die 12 and the second semiconductor die 16 in a manner that prevents or minimizes physical contact and/or electrical shorting between the laterally extending conductive elements 26 and the active surfaces 14, 18 of the semiconductor dice 12, 16. At least a portion of each laterally extending conductive element 26 may pass through at least one dielectric structure 54. In this configuration, each dielectric structure 54 may be configured to support and hold at least a portion of the laterally extending conductive element 26 passing therethrough between the active surface 14 of the first semiconductor die 12 and the active surface 18 of the second semiconductor die 16. Moreover, each dielectric structure 54 may be attached to both the active surface 14 of the first semiconductor die 12 and the active surface 18 of the second semiconductor die 16.

Each dielectric structure 54 may comprise a discrete dot, glob, or bump of adhesive material, as shown in FIG. 3. The adhesive material may comprise a thermoplastic polymer resin or a thermoset polymer resin (such as, for example, silicone, a silicone-based material, an epoxy, or an epoxy-based material). Moreover, the adhesive material may include a filler material such as, for example, particles of alumina or silica. In alternative embodiments, each dielectric structure 54 may include a preformed dielectric structure secured to one or both of the first semiconductor die 12 and the second semiconductor die 16. By way of example and not limitation, each dielectric structure 54 may include a first piece of dielectric tape or film attached to the active surface 14 of the first semiconductor die 12 and a second piece of dielectric tape or film attached to both the first piece of dielectric tape or film and the active surface 18 of the second semiconductor die 16, as described in further detail below.

The semiconductor device assembly 50 may include an encapsulant material 36 to physically protect and electrically insulate the first semiconductor die 12, the second semiconductor die 16, and the laterally extending conductive elements 26. The encapsulant material 36 may include, for example, a thermoplastic polymer resin or a thermoset polymer resin (such as, for example, silicone, silicone-based materials, epoxy and epoxy-based materials), which may be filled with particulate material (such as, for example, alumina or silica particles). Alternatively, the encapsulant material 36 may include a ceramic material (such as, for example, silicon nitride or alumina). The composition of the encapsulant material 36 may be selected and/or tailored to exhibit a thermal expansion coefficient that is substantially similar to a coefficient of thermal expansion exhibited by the first semiconductor die 12 and the second semiconductor die 16. Moreover, the size and shape of the discrete dielectric structures 54 may be selected to facilitate introduction of the encapsulant material 36 into the space between the first semiconductor die 12 and the second semiconductor die 16, and may be selected to provide a selected or predetermined stand-off between the first semiconductor die 12 and the second semiconductor die 16. In this configuration, defects and failures due to thermal expansion mismatch, which may occur when the semiconductor device assembly 50 is subjected to thermal cycling during operation, may be reduced or minimized.

By way of example and not limitation, the substrate 22 may include a circuit board. The substrate 22 may be substantially comprised of, for example, Bismalemide Triazine (BT) resin, a ceramic, or comprise an FR-4, or FR-5 laminate. Alternatively, the substrate 22 may comprise an interposer, a tape substrate or other type of flexible substrate, a semiconductor die, a complete semiconductor wafer, or a partial semiconductor wafer. Conductive traces that extend horizontally on or through the substrate 22 and conductive vias that extend substantially vertically through the substrate 22 may be used to provide electrical communication between the conductive terminals 30 on the first surface of the substrate 22 and conductive terminals 32 provided on a second, opposite surface of the substrate 22. Conductive solder balls or bumps 34 may be provided on the conductive terminals 32 and used to structurally and electrically couple the semiconductor device assembly 50 to a higher-level substrate such as a circuit board. Alternatively, conductive or conductor-filled epoxy material or anisotropically conductive tape or film may be provided on the conductive terminals 32 and used to structurally and electrically couple the semiconductor device assembly 50 to a higher-level substrate.

The first semiconductor die 12 may be mounted on the substrate 22 such that the back side 15 is disposed adjacent and attached to the substrate 22. By way of example and not limitation, the back side 15 of the first semiconductor die 12 may be attached to a surface of the substrate 22 by way of an adhesive material 24. The adhesive material 24 may include commercially available die attach paste, double-sided adhesive tape or film, a thermoplastic polymer material, or a thermoset polymer material. Die attach pastes are commercially available from, for example, Ablestik of Rancho Dominguez, Calif.

As an illustrative method for forming the semiconductor device assembly 50 shown in FIG. 3, the substrate 22 (such as, for example, a circuit board), the first semiconductor die 12, and the second semiconductor die 16 each may be provided. Such substrates and semiconductor dice are commercially available. Alternatively, the substrate 22 and the semiconductor dice 12, 16 may be fabricated using techniques known in the art. The back side 15 of the first semiconductor die 12 may be attached to a surface of the substrate 22 by, for example, using the previously described adhesive material 24. The adhesive material 24 may be applied to the substrate 22, the back side 15 of the first semiconductor die 12, or to both the substrate 22 and the back side 15 of the first semiconductor die 12. If the adhesive material 24 comprises a curable fluid, gel, or paste, the adhesive material 24 may be applied in the fluid form as previously described, the back side 15 of the first semiconductor die 12 may be pressed or held against the substrate 22, and the adhesive material 24 may be consolidated or cured to a solid form by, for example, subjecting the adhesive material 24 to heat or electromagnetic radiation (such as, for example, ultraviolet radiation).

A plurality of laterally extending conductive elements 26 may be provided. A first end of each laterally extending conductive element 26 may be structurally and electrically coupled to a conductive terminal 30 on or in a surface of the substrate 22. A second end of each laterally extending conductive element 26 may be structurally and electrically coupled to a bond pad 28 on or in an active surface of the first semiconductor die 12. By way of example and not limitation, the laterally extending conductive elements 26 may include bond wires, and conventional wire bonding techniques and equipment known in the art may be used to structurally and electrically couple the ends of such bond wires to the conductive terminals 30 and the bond pads 28. As an example, wire bonding machines and equipment are available from, for example, Kulick and Soffa of Willow Grove, Pa. and Palomar Technologies of Carlsbad, Calif.

Prior to securing the second semiconductor die 16 to the first semiconductor die 12, a conductive structure 52 may be structurally and electrically coupled to each of at least some of the bond pads 28' on or in the active surface 18 of the second semiconductor die 16. Equipment, machines, and methods for structurally and electrically coupling conductive structures such as, for example solder balls or bumps, conductive or conductor-filled epoxy balls or bumps, etc., are known in the art and may be used to structurally and electrically couple a conductive structure 52 to each of at least some of the bond pads 28' on or in the active surface 18 of the second semiconductor die 16.

The second semiconductor die 16 may be oriented and positioned relative to the first semiconductor die 12 such that the active surface 18 of the second semiconductor die 16 faces the active surface 14 of the first semiconductor die, and such that at least some conductive structures 52 of the plurality are aligned with and contacting at least some bond pads 28 of the first semiconductor die 12. At least a portion of some laterally extending conductive elements 26 (a portion proximate the end of each laterally extending conductive element 26 that is coupled to a bond pad 28 of the first semiconductor die 12) may be pinned or sandwiched between a conductive structure 52 and a bond pad 28 of the first semiconductor die as the conductive structures 52 are brought into physical contact with the bond pads 28 of the first semiconductor die 12. In other words, at least some conductive structures 52 may be aligned with and pressed against a point of attachment or coupling between a laterally extending conductive element 26 and a bond pad 28 of the first semiconductor die 12. Alternatively, at least some conductive structures 52 may be aligned with and pressed against a bond pad 28 of the first semiconductor die 12 at a location or point that is laterally adjacent a point of attachment or coupling between a laterally extending conductive element 26 and a bond pad 28 of the first semiconductor die 12. These conductive structures 52 then may be structurally and electrically coupled to the corresponding bond pads 28 of the first semiconductor die 12 with which the conductive structures 52 are aligned and in physical contact.

By way of example and not limitation, if the conductive structures 52 include solder balls or bumps, the solder balls or bumps may be subjected to a reflow process at an elevated temperature to structurally and electrically couple the solder balls or bumps to the bond pads 28 of the first semiconductor die 12. If the bond pads 28 of the first semiconductor die 12, the bond pads 28' of the second semiconductor die 16, and the conductive structures 52 include or are coated with gold or a gold alloy, the conductive structures 52 may be structurally and electrically coupled to the corresponding bond pads 28 of the first semiconductor die 12 using an ultrasonic welding process or a simple pressure contact process to form what is often referred to as a "gold-to-gold interconnect" (GGI) structure. If the conductive structures 52 include a curable conductive or conductor-filled epoxy material, dots, bumps, or globs of epoxy material may be applied to the bond pads 28' of the second semiconductor die 16 (or to the bond pads 28 of the first semiconductor die 12) in fluid form, the second semiconductor die 16 may be aligned with the first semiconductor die 12 as previously described such that each glob of epoxy material is in direct physical contact with both a bond pad 28 of the first semiconductor die 12 and a bond pad 28' of the second semiconductor die 16. Each glob of epoxy material may also be in direct physical contact with at least a portion of a laterally extending conductive element 26. The epoxy material then may be cured to a solid state by, for example, subjecting the epoxy material to heat or electromagnetic radiation (such as, for example, ultraviolet radiation). In this manner, the second end of at least some of the laterally extending conductive elements 26 may be structurally and electrically coupled to at least one bond pad 28 of the first semiconductor die 12, a bond pad 28' of the second semiconductor die 16, and a conductive structure 52 when the conductive structures 52 are structurally and electrically coupled to the bond pads 28 of the first semiconductor die 12.

If each dielectric structure 54 includes a dot, bump, or glob of dielectric adhesive material such as, for example, a thermoplastic polymer resin or a thermoset polymer resin as previously described, the dielectric adhesive material may by applied to the surface of the first semiconductor die 12 after providing the laterally extending conductive elements 26 and prior to securing the second semiconductor die 16 to the first semiconductor die 12 such that at least a portion of each laterally extending conductive element 26 extends through the dot, glob, or bump of dielectric adhesive material. By way of example and not limitation, globs of the dielectric adhesive material may be applied in a fluid state to the surface of the first semiconductor die 12 after providing the laterally extending conductive elements 26 such that a portion of each laterally extending conductive element 26 extends through and is covered by a glob of dielectric adhesive material. The second semiconductor die 16 then may be aligned with and positioned relative to the first semiconductor die 12. The globs of dielectric adhesive material may be sized such that each glob is in direct contact with both the first semiconductor die 12 and the second semiconductor die 16 when the second semiconductor die 16 is aligned with and positioned relative to the first semiconductor die 12. The fluid dielectric adhesive material then may be consolidated or cured to form a solid dielectric structure 54. As a result, each dielectric structure 54 may be attached to both the active surface 14 of the first semiconductor die 12 and the active surface 18 of the second semiconductor die 16.

Alternatively, the dielectric adhesive material may be applied to a surface of the second semiconductor die 16, or globs of the dielectric adhesive material may be applied to the surface of the first semiconductor die 12 in a first pattern, and globs of the dielectric adhesive material may be applied to the surface of the second semiconductor die 16 in a second pattern that is a mirror image of the first pattern, such that the globs of dielectric adhesive material on the first semiconductor die 12 are aligned with the globs of dielectric adhesive material on the second semiconductor die 16.

If each dielectric structure 54 includes a first piece of dielectric tape or film attached to the active surface 14 of the first semiconductor die 12 and a second piece of dielectric tape or film attached to both the first piece of dielectric tape or film and the active surface 18 of the second semiconductor die 16, the first pieces of dielectric tape or film may be applied to the first semiconductor die 12 prior to forming the laterally extending conductive elements 26. The second pieces of dielectric tape or film may be applied to the second semiconductor die 16 prior to at least partially securing the second semiconductor die 16 to the first semiconductor die 12 by way of the conductive structures 52. Alternatively, the second pieces of dielectric tape or film may be applied to the first pieces of dielectric tape or film over the laterally extending conductive elements 26, and the second semiconductor die 16 may subsequently be attached to the second pieces of dielectric tape or film.

An encapsulant material 36 may be provided using techniques known in the art such as, for example, transfer molding or injection molding processes or radial-spread coating processes (often referred to as "glob-top" processes).

Optionally, a dielectric underfill or adhesive material (not shown) may be provided in the areas between the first semiconductor die 12 and the second semiconductor die 16 not occupied by the dielectric structures 54, laterally extending conductive elements 26, or conductive structures 52 prior to encapsulating the assembly with the encapsulant material 36. The underfill material may be the same as or different from the encapsulant material 36. In either case, the underfill material may include a dielectric material and may be selected and/or tailored to exhibit a thermal expansion coefficient that is substantially similar to a coefficient of thermal expansion exhibited by the first semiconductor die 12 and the second semiconductor die 16.

In alternative methods that also embody teachings of the present invention, laterally extending conductive elements 26 may be provided over and positioned relative to the first semiconductor die 12 prior to attaching the first semiconductor die 12 to the substrate 22, the second semiconductor die 16 may be attached to the first semiconductor die 12 prior to attaching the first semiconductor die 12 to the substrate 22, or the dielectric structures 54 may be provided on and secured to the second semiconductor die 16 prior to securing the second semiconductor die 16 to the first semiconductor die 12. These variations are merely examples of various embodiments of methods that embody teachings of the present invention. Many other variations in method sequence, etc., are also possible and within the scope of the present invention.

Figure 7A:
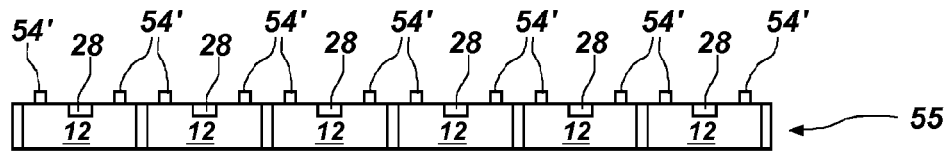
FIGS. 7A-7C illustrate various subassemblies that may be used to fabricate multi-chip modules that embody teachings of the present invention at the wafer level.
Figure 7B:
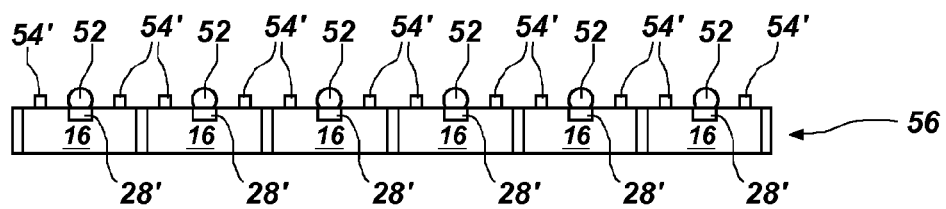

Furthermore, the methods described herein may be adapted to be performed at the wafer level. Referring to FIG. 7A, a plurality of first semiconductor dice 12 may be formed on or in a wafer 55 as known in the art. By way of example and not limitation, at least a portion 54' of each dielectric structure 54 may be applied to the plurality of first semiconductor dice 12 at the wafer level, as shown in FIG. 7A. Referring to FIG. 7B, a plurality of second semiconductor dice 16 may be formed on or in a wafer 56 as known in the art. At least a portion 54' of each dielectric structure 54 and/or the conductive structures 52 may be applied to the plurality of second semiconductor dice 16 at the wafer level, as shown in FIG. 7B. Moreover, a plurality of semiconductor device assemblies 50 (FIG. 3) may be fabricated on a relatively large substrate 57 shown in FIG. 7C that includes a plurality of integral substrates 22. By way of example and not limitation, the wafer 55 shown in FIG. 7A that comprises the plurality of first semiconductor dice 12 may be diced to form individual first semiconductor dice 12, which may be attached to the individual substrates 22 of the relatively larger substrate 57 shown in FIG. 7C. Laterally extending conductive elements 26 (not shown in FIGS. 7A-7C) then may be coupled to the individual substrates 22 and the respective first semiconductor dice 12. The wafer 56 shown in FIG. 7B that comprises the plurality of second semiconductor dice 16 may be diced to form individual second semiconductor dice 16, which may be attached to the first semiconductor dice 12 while they are disposed on the relatively larger substrate 57.

Figure 7C:
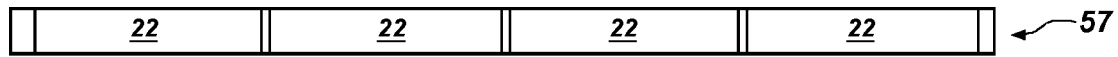

Alternatively, the spacing of the second semiconductor dice 16 in the wafer 56 shown in FIG. 7B may be configured such that the wafer 56 may be applied over the plurality of first semiconductor dice 12 while they are secured to the relatively larger substrate 57 shown in FIG. 7C.

If the laterally extending conductive elements 26 (not shown in FIGS. 7A-7C) comprise leads of a lead frame or conductive traces carried by a flexible dielectric substrate (such as used in conventional tape-automated bonding (TAB) processes), at least a portion of the laterally extending conductive elements 26 may be positioned above the first semiconductor dice 12 of the wafer 55, and the wafer 56 may be positioned over the wafer 55 and the laterally extending conductive elements 26. The first semiconductor dice 12 may be structurally and electrically coupled to the second semiconductor dice 16 by way of the conductive structures 52 as previously described, and electrical communication may be provided between the laterally extending conductive elements 26 (not shown in FIGS. 7A-7C) and at least one of the bond pads 28, the bond pads 28', and the conductive structures 52, as also previously described. The wafer 55, the wafer 56, and the relatively larger substrate 57 then may be simultaneously diced, and electrical communication may be provided between the laterally extending conductive elements 26 (not shown in FIGS. 7A-7C) and the individual substrates 22 using, for example, bond wires or conductive or conductor filled epoxy selectively provided along the lateral edges of the resulting individual semiconductor device assemblies.

Figure 4A:
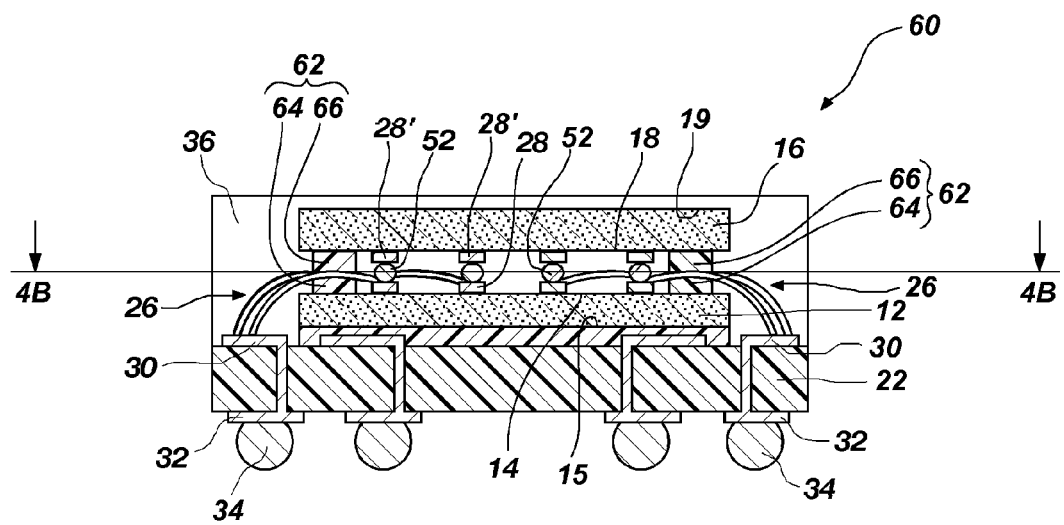
FIG. 4A is a cross-sectional side view of another illustrative semiconductor device assembly that embodies teachings of the present invention.
Figure 4B:
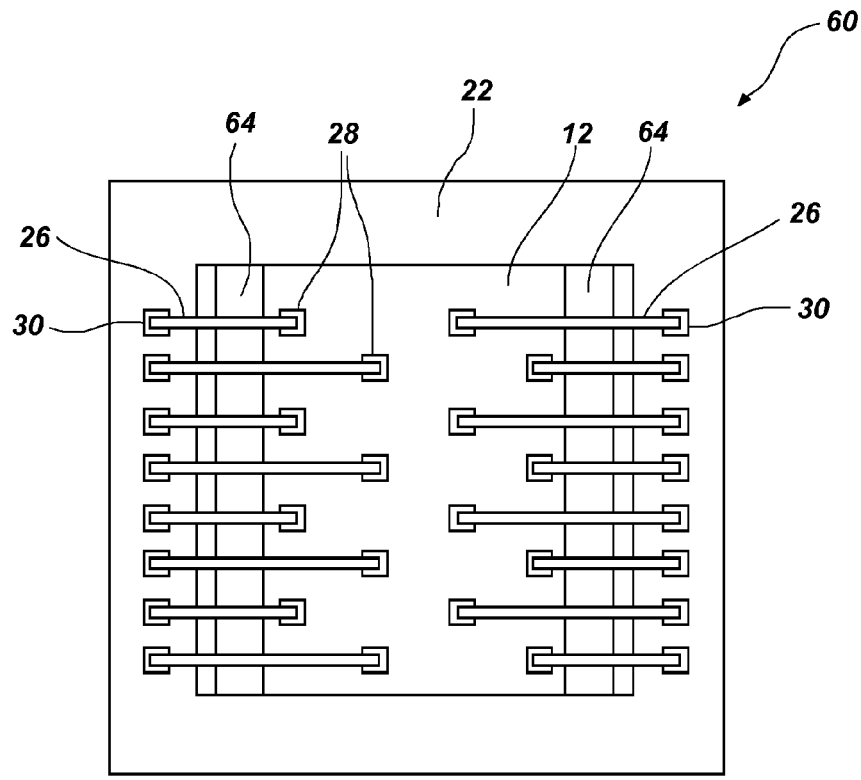
FIG. 4B is a cross-sectional view of the semiconductor device assembly shown in FIG. 4A taken along section line 4B-4B shown therein.

Another illustrative semiconductor device assembly 60 that embodies teachings of the present invention is shown in FIGS. 4A and 4B. The semiconductor device assembly 60 is similar to the semiconductor device assembly 50 previously described in relation to FIG. 3 and includes a multi-chip module having a first semiconductor die 12, a second semiconductor die 16, and an optional substrate 22.

Referring to FIG. 4A, the active surface 14 of the first semiconductor die 12 faces the active surface 18 of the second semiconductor die 16. At least some of the bond pads 28 of the first semiconductor die 12 may be disposed in a first selected connection pattern, and at least some of the bond pads 28' of the second semiconductor die 16 may be disposed in a second selected connection pattern that is a mirror image of the first selected connection pattern. In this configuration, at least some of the bond pads 28 of the first semiconductor die 12 may be aligned with at least some of the bond pads 28' of the second semiconductor die 16 when the first semiconductor die 12 and the second semiconductor die 16 are positioned and aligned in a face-to-face configuration, as shown in FIG. 4A.

The semiconductor device assembly 60 may also include a plurality of electrically conductive structures 52, each of which may be electrically and structurally coupled to a bond pad 28 of the first semiconductor die 12 and to a bond pad 28' of the second semiconductor die 16 in a manner such as that described in relation to the semiconductor device assembly 50 shown in FIG. 3.

Laterally extending conductive elements 26 may be used to provide electrical communication between the integrated circuitry within the semiconductor dice 12, 16 and conductive terminals 30 on or in a surface of the substrate 22. A first end of each laterally extending conductive element 26 may be structurally and electrically coupled directly to a conductive terminal 30 on or in a surface of the substrate 22, and a second end of each laterally extending conductive element 26 may be structurally and electrically coupled to at least one of a bond pad 28 of the first semiconductor die 12, a bond pad 28' of the second semiconductor die 16, and a conductive structure 52.

The semiconductor device assembly 60 may also include a plurality of dielectric structures 62 disposed between the active surface 14 of the first semiconductor die 12 and the active surface 18 of the second semiconductor die 16 in a manner similar to that previously described in relation to the semiconductor device assembly 50 shown in FIG. 3. At least a portion of each laterally extending conductive element 26 may pass through a dielectric structure 62. As shown in FIG. 4A, the dielectric structures 62 may include a first piece of dielectric tape or film 64 attached to the active surface 14 of the first semiconductor die 12, and a second piece of dielectric tape or film 66 attached to both the first piece of dielectric tape or film 64 and the active surface 18 of the second semiconductor die 16. By way of example and not limitation, the first piece of dielectric tape or film 64 and the second piece of dielectric tape or film 66 each may include a double-sided adhesive tape. The double-sided adhesive tape may include, for example, a polymer material such as polyimide and may have a pressure sensitive adhesive applied to both major sides of the tape. Such double-sided adhesive tapes are commercially available from, for example, Lintec Corporation of Tokyo, Japan. In this configuration, each dielectric structure 62 may be configured to support and position at least a portion of the laterally extending conductive element 26 passing therethrough between the active surface 14 of the first semiconductor die 12 and the active surface 18 of the second semiconductor die 16, which may prevent physical contact and/or electrical shorting between the laterally extending conductive elements 26 and the active surfaces 14, 18 of the semiconductor dice 12, 16.

Referring to FIG. 4B, the bond pads 28 of the first semiconductor die 12 may be disposed in a first selected connection pattern or array, and the bond pads 28' of the second semiconductor die 16 (not shown in FIG. 4B) may be disposed in a second selected connection pattern or array that is a mirror image of the first selected connection pattern or array. As shown in FIG. 4B, in some embodiments the patterns in which the bond pads 28, 28' are disposed may include two or more rows of offset or staggered bond pads 28, 28', which may allow relatively increased density packing or placement of the bond pads 28, 28' on the active surfaces of the semiconductor dice 12, 16. Furthermore, the conductive terminals 30 on the surface of the substrate 22 may also be offset or staggered (not shown) in a manner similar to the bond pads 28, 28'.

As also seen in FIG. 4B, each piece of dielectric tape or film 64 may be substantially elongated and may extend along or proximate a lateral edge of the semiconductor dice 12, 16. In this configuration, each of the laterally extending conductive elements 26 may be positioned or sandwiched between a first piece of dielectric tape or film 64 and a second piece of dielectric tape or film 66, and at least a portion of each of a plurality of laterally extending conductive elements 26 may pass through each dielectric structure 62 (FIG. 4A). Alternatively, the semiconductor device assembly 60 may include a plurality of discrete dielectric structures through which at least a portion of only one laterally extending conductive element 26 extends.

Figure 5:
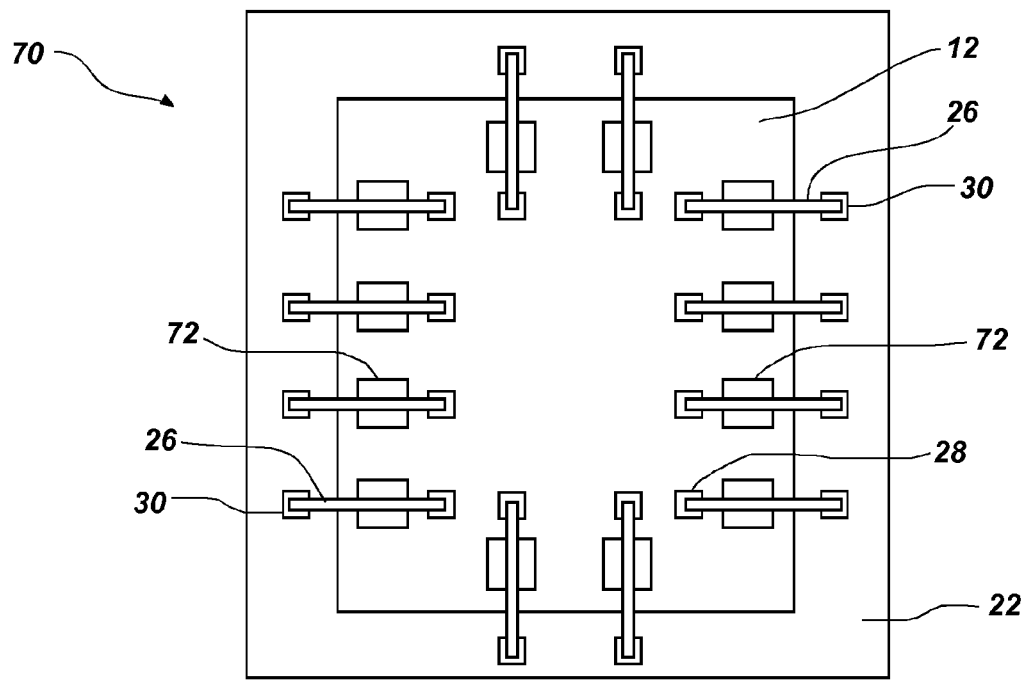
FIG. 5 is a cross-sectional view of another illustrative semiconductor device assembly that embodies teachings of the present invention.

A portion of yet another illustrative semiconductor device assembly 70 that embodies teachings of the present invention is shown in FIG. 5. FIG. 5 is a cross-sectional view of the semiconductor device assembly 70, the cross-sectional view being similar to the cross-sectional view of the semiconductor device assembly 60 shown in FIG. 4B. The semiconductor device assembly 70 is similar to the semiconductor device assembly 60 previously described and includes a multi-chip module having a first semiconductor die 12, a second semiconductor die 16 (not shown in FIG. 5), and a substrate 22. In contrast to the semiconductor device assembly 60 shown in FIGS. 4A and 4B, the semiconductor device assembly 70 includes a plurality of discrete dielectric structures through which at least a portion of only one laterally extending conductive element 26 extends. For example, each discrete dielectric structure may include a first piece of dielectric tape or film 72 attached to the first semiconductor die 12 and a second piece of dielectric tape or film (not shown) attached to the second semiconductor die 16 (not shown in FIG. 5) and aligned with the first piece of dielectric tape or film 72. By way of example and not limitation, each piece of dielectric tape or film may include a double-sided adhesive polyimide tape as previously described in relation to the semiconductor device assembly 60 shown in FIGS. 4A and 4B.

As further shown in FIG. 5, the bond pads 28 on the active surface of the first semiconductor die 12 and the bond pads 28' on the active surface of the second semiconductor die 16 may be disposed in a connection pattern in which each bond pad 28, 28' is located proximate a lateral edge of the respective semiconductor die 12, 16.

While each of the previously described semiconductor device assemblies include a first semiconductor die 12 having bond pads 28 arranged or disposed in a first selected connection pattern and a second semiconductor die 16 having bond pads 28' arranged or disposed in a second selected connection pattern that is identical to, or a mirror image of, the first selected connection pattern, other semiconductor device assemblies that also embody teachings of the present invention may include a second semiconductor die 16 having bond pads 28' that are arranged or disposed in a second selected connection pattern that is not identical to, or a mirror image of, a first selected connection pattern of bond pads 28 of a first semiconductor die 12. By way of example and not limitation, in such a semiconductor device assembly, conductive structures 52 may be provided on each of the bond pads 28 of the first semiconductor die 12 in addition to each of the bond pads 28' of the second semiconductor die 16. Relatively rigid laterally extending conductive elements 26 such as conductive leads of a lead frame then may be provided between the active surface 14 of the first semiconductor die 12 and the active surface 18 of the second semiconductor die 16. A first side of at least some of the laterally extending conductive elements 26 may be electrically and structurally coupled to a conductive structure 52 attached to a bond pad 28 of the first semiconductor die 12, and a second side of the same laterally extending conductive elements 26 may be electrically and structurally coupled to a conductive structure 52 attached to a bond pad 28' of the second semiconductor die 16. In such a configuration, the bond pads 28 of the first semiconductor die 12 may not and need not be aligned with the bond pads 28' of the second semiconductor die 16 when the first semiconductor die 12 and the second semiconductor die 16 are in a face-to-face configuration.

Figure 6:
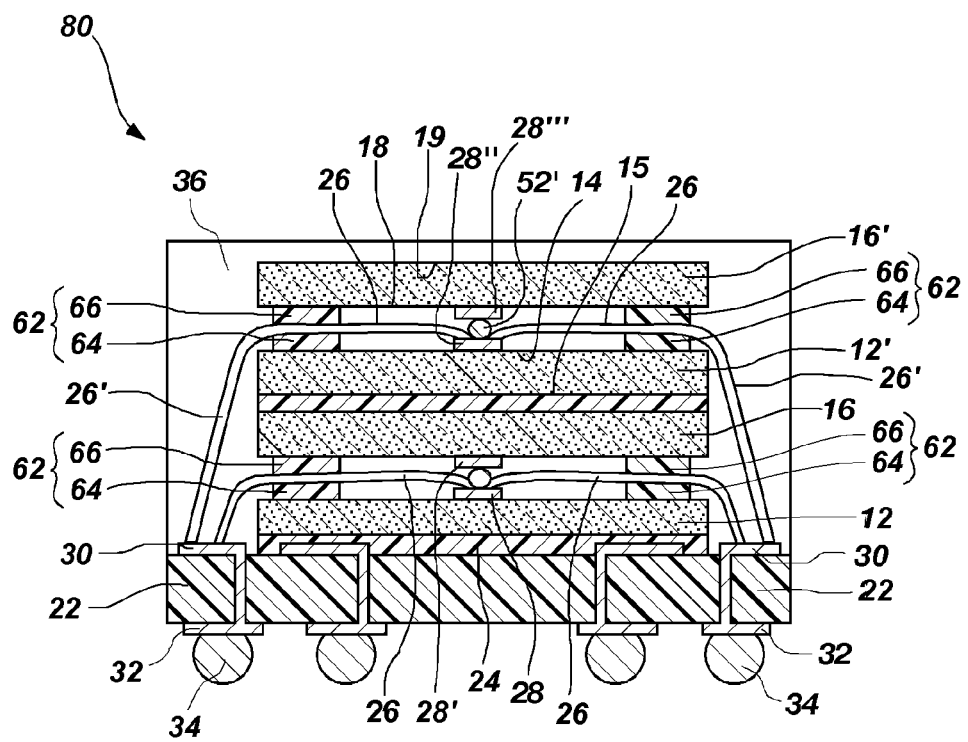
FIG. 6 is a cross-sectional side view of yet another illustrative semiconductor device assembly that embodies teachings of the present invention.

As previously discussed, the teachings of the present invention are not limited to devices and methods that include only two semiconductor dice. Still another illustrative semiconductor device assembly 80 that embodies teachings of the present invention is shown in FIG. 6. The semiconductor device assembly 80 is similar to the semiconductor device assembly 60 previously described in relation to FIGS. 4A and 4B and includes a multi-chip module having a first semiconductor die 12, a second semiconductor die 16, and a substrate 22. The semiconductor device assembly 80 further includes, however, additional semiconductor dice.

By way of example and not limitation, the semiconductor device assembly 80 may include an additional first semiconductor die 12' and an additional second semiconductor die 16'. An active surface 14 of the additional first semiconductor die 12' faces an active surface 18 of the additional second semiconductor die 16'. At least some of the bond pads 28 of the first semiconductor die 12 are disposed in a first selected connection pattern, and at least some of the bond pads 28' of the second semiconductor die 16 are disposed in a second selected connection pattern that is a mirror image of the first selected connection pattern. Similarly, at least some of the bond pads 28" of the additional first semiconductor die 12' are disposed in a third selected connection pattern, and at least some of the bond pads 28''' of the additional second semiconductor die 16' are disposed in a fourth selected connection pattern that is a mirror image of the third selected connection pattern. The third selected connection pattern may be identical to the first selected connection pattern, and the fourth selected connection pattern may be identical to the second selected connection pattern. At least some of the bond pads 28" of the additional first semiconductor die 12' may be aligned with at least some of the bond pads 28''' of the additional second semiconductor die 16' when the additional first semiconductor die 12' and the additional second semiconductor die 16' are in a face-to-face configuration, as shown in FIG. 6.

The semiconductor device assembly 80 may also include an additional plurality of electrically conductive structures 52', each of which may be electrically and structurally coupled to a bond pad 28" of the additional first semiconductor die 12' and to a bond pad 28''' of the additional second semiconductor die 16'.

Additional laterally extending conductive elements 26' may be used to provide electrical communication between the integrated circuitry within the semiconductor dice 12', 16' and conductive terminals 30 on or in a surface of the substrate 22. A first end of each additional laterally extending conductive element 26' may be structurally and electrically coupled directly to a conductive terminal 30 on a surface of the substrate 22, and a second end of each additional laterally extending conductive element 26' may be structurally and electrically coupled directly to at least one of a bond pad 28" of the additional first semiconductor die 12', a bond pad 28''' of the additional second semiconductor die 16', and an additional conductive structure 52'.

In alternative embodiments, the second additional semiconductor die 16' may be eliminated from the semiconductor device assembly 80, or the semiconductor device assembly 80 may include any number of additional semiconductor dice.

The semiconductor device assembly 80 may also include an encapsulant material 36 as previously described herein.

Figure 8:
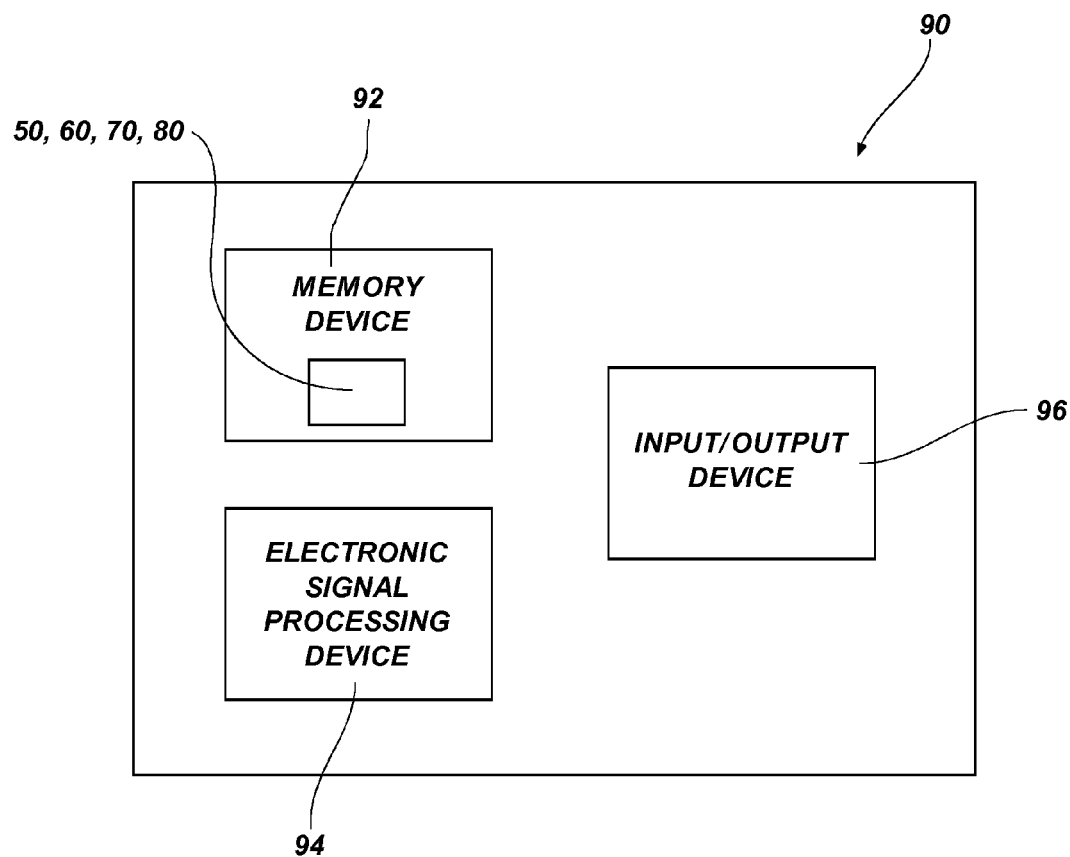
FIG. 8 is a block diagram of an illustrative electronic system that embodies teachings of the present invention.

A block diagram of an illustrative electronic system 90 that embodies teachings of the present invention is shown in FIG. 8. The electronic system 90 includes at least one memory device 92, at least one electronic signal processing device 94 (often referred to as a "microprocessor"), and at least one input or output device 96 such as, for example, a mouse or other pointing device, keyboard, control panel, monitor, printer, etc., which may communicate electrically with at least one of the memory device 92 and the electronic signal processing device 94.

The at least one memory device 92 may include a semiconductor device assembly that embodies teachings of the present invention such as, by way of non-limiting example, the previously described semiconductor device assembly 50 shown in FIG. 3, the previously described semiconductor device assembly 60 shown in FIGS. 4A and 4B, the previously described semiconductor device assembly 70 shown in FIG. 5, or the previously described semiconductor device assembly 80 shown in FIG. 6. In alternative embodiments, the electronic signal processing device 94 may include a semiconductor device assembly that embodies teachings of the present invention.

The teachings of the present invention may enable the fabrication of multi-chip modules that include less laterally extending conductive elements such as bond wires, conductive leads, conductive traces carried by a flexible dielectric substrate such as tape or film, such as those used in conventional tape automated bonding (TAB) processes, etc., thereby reducing the number of elements and steps required to fabricate a multi-chip module.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims, which follow.

What is claimed is:

1. A method of manufacturing a semiconductor device assembly, the method comprising:
   attaching a back side of a first semiconductor die to a substrate;
   structurally and electrically coupling a first end of each of a plurality of laterally extending conductive elements to one of a plurality of conductive terminals on or in a surface of the substrate;
   structurally and electrically coupling a second end of each of the plurality of laterally extending conductive elements to one of a plurality of bond pads on or in an active surface of the first semiconductor die;
   structurally and electrically coupling each of a plurality of conductive structures to one of a plurality of bond pads of a second semiconductor die;
   aligning at least some conductive structures of the plurality with at least some of the plurality of bond pads of the first semiconductor die, an active surface of the second semiconductor die facing an active surface of the first semiconductor die;
   structurally and electrically coupling the at least some conductive structures of the plurality to the at least some of the plurality of bond pads of the first semiconductor die; and
   providing a plurality of vertically stacked discrete dielectric structures between the active surface of the first semiconductor die and the active surface of the second semiconductor die, a portion of each laterally extending conductive element passing between and in direct contact with one of the vertically stacked dielectric structures.

2. The method of claim 1, wherein structurally and electrically coupling a first end of each of a plurality of laterally extending conductive elements comprises structurally and electrically coupling a first end of each of a plurality of bond wires to one of a plurality of conductive terminals on or in a surface of the substrate, and wherein structurally and electrically coupling a second end of each of the plurality of laterally extending conductive elements comprises structurally and electrically coupling a second end of each of the plurality of bond wires to one of the plurality of bond pads on or in an active surface of the first semiconductor die.

3. The method of claim 1, further comprising structurally and electrically coupling the second end of each of the plurality of laterally extending conductive elements to one of the plurality of conductive structures.

4. The method of claim 1, wherein providing a plurality of discrete dielectric structures comprises applying a plurality of discrete dielectric structures to the active surface of at least one of the first semiconductor die and the second semiconductor die at a wafer level.

5. The method of claim 1, wherein providing a plurality of discrete dielectric structures comprises providing a plurality of discrete dielectric structures each comprising one of silicone, a silicone-based material, epoxy, and an epoxy-based material.

6. The method of claim 1, wherein providing a plurality of discrete dielectric structures comprises providing a plurality of discrete dielectric structures each comprising a first discrete piece of tape attached to the active surface of the first semiconductor die and a second discrete piece of tape attached to the active surface of the second semiconductor die, a portion of each laterally extending conductive element passing between the first discrete piece of tape and the second discrete piece of tape.

7. The method of claim 6, further comprising at least one of attaching a first discrete piece of tape to the active surface of the first semiconductor die at the wafer level and attaching a second discrete piece of tape to the active surface of the second semiconductor die at the wafer level.

8. The method of claim 1, wherein providing a plurality of discrete dielectric structures comprises positioning each discrete dielectric structure of the plurality proximate a lateral edge of at least one of the first semiconductor die and the second semiconductor die.

9. The method of claim 1, further comprising attaching each discrete dielectric structure to both the active surface of the first semiconductor die and the active surface of the second semiconductor die.

10. The method of claim 1, wherein structurally and electrically coupling each of a plurality of conductive structures to one of a plurality of bond pads of a second semiconductor die comprises structurally and electrically coupling each of a plurality of solder balls to one of the plurality of bond pads of the second semiconductor die.

11. The method of claim 10, wherein structurally and electrically coupling the at least some conductive structures of the plurality to the at least some of the plurality of bond pads of the first semiconductor die comprises reflowing at least some of the solder balls of the plurality.

12. The method of claim 1, wherein attaching a back side of a first semiconductor die to a substrate comprises attaching a back side of the first semiconductor die to a surface of a circuit board.

13. The method of claim 1, further comprising:
attaching a back side of a first additional semiconductor die to a back side of the second semiconductor die;
structurally and electrically coupling a first end of each of an additional plurality of laterally extending conductive elements to one of the plurality of conductive terminals on or in the surface of the substrate;
structurally and electrically coupling a second end of each of the additional plurality of laterally extending conductive elements to one of a plurality of bond pads on or in an active surface of the first additional semiconductor die;
structurally and electrically coupling each of an additional plurality of conductive structures to one of a plurality of bond pads of a second additional semiconductor die;
aligning at least some conductive structures of the additional plurality with at least some of the plurality of bond pads of the first additional semiconductor die, an active surface of the second additional semiconductor die facing an active surface of the first additional semiconductor die; and
structurally and electrically coupling the at least some conductive structures of the additional plurality to the at least some of the plurality of bond pads of the first additional semiconductor die.

14. The method of claim 1, further comprising encapsulating the first semiconductor die and the second semiconductor die with a dielectric encapsulant material.

15. The method of claim 1, wherein attaching a back side of a first semiconductor die to a substrate comprises attaching a plurality of first semiconductor dice to a surface of a single substrate.

16. The method of claim 15, further comprising dicing the single substrate.

17. A method of manufacturing a semiconductor device assembly, the method comprising:
coupling a first end of each of a plurality of laterally extending conductive elements to one of a plurality of conductive terminals on or in a surface of a substrate proximate to a first semiconductor die comprising a back side mounted to the substrate;
coupling a second end of each of the plurality of laterally extending conductive elements to one of a first plurality of bond pads disposed on or in an active surface of the first semiconductor die;
coupling conductive structures to at least some of a second plurality of bond pads disposed on or in an active surface of a second semiconductor die;
aligning and coupling at least some of the conductive structures with at least some of the first plurality of bond pads of the first semiconductor die; and
providing a plurality of vertically stacked discrete dielectric structures between the active surface of the first semiconductor die and the active surface of the second semiconductor die, a portion of each laterally extending conductive element passing between and in direct contact with one of the vertically stacked dielectric structures.

18. The method of claim 17, wherein coupling the conductive structures to at least some of the second plurality of bond pads disposed on or in the active surface of the second semiconductor die comprises coupling the conductive structures to at least some of the second plurality of bond pads that are arranged in a pattern that is substantially identical to a pattern in which the first plurality of bond pads are disposed on or in the active surface of the first semiconductor die.

19. The method of claim 17, wherein aligning and coupling at least some of the conductive structures with at least some of the first plurality of bond pads of the first semiconductor die comprises pinning at least one of the plurality of laterally extending conductive elements between at least one of the conductive structures and at least one of the first plurality of bond pads.

20. The method of claim 17, wherein aligning and coupling at least some of the conductive structures with at least some of the first plurality of bond pads of the first semiconductor die comprises pressing at least one of the conductive structures against one of the first plurality of bond pads at a location that is laterally adjacent to a point of coupling between one of the plurality of laterally extending conductive elements and the one of the first plurality of bond pads.

\* \* \* \* \*